United States Patent [19]
Feuersanger et al.

[11] 3,979,738
[45] Sept. 7, 1976

[54] COMPOUND DETECTOR FOR MAGNETIC DOMAIN MEMORY DEVICES

[75] Inventors: Alfred E. Feuersanger, Framingham; Charles Brecher, Lexington, both of Mass.

[73] Assignee: GTE Laboratories Incorporated, Waltham, Mass.

[22] Filed: Mar. 12, 1975

[21] Appl. No.: 557,854

[52] U.S. Cl. .................... 340/174 TF; 340/174 EB; 340/174 HA; 340/174 YC
[51] Int. Cl.² ......................................... G11C 11/14
[58] Field of Search ................. 340/174 TF, 174 SR

[56] References Cited
UNITED STATES PATENTS

| | | | |
|---|---|---|---|
| 3,723,716 | 3/1973 | Bobeck et al. | 340/174 TF |
| 3,868,661 | 2/1975 | Bonyhard et al. | 340/174 TF |
| 3,885,233 | 5/1975 | Minnick et al. | 340/174 TF |
| 3,922,652 | 11/1975 | Sandfort | 340/174 TF |
| 3,952,291 | 4/1976 | Bailey et al. | 340/174 TF |

Primary Examiner—James W. Moffitt
Attorney, Agent, or Firm—Irving M. Kriegsman; Leslie J. Hart

[57] ABSTRACT

In a magnetic domain memory, a domain detector system includes a passive domain splitter in a domain propagation track, a first detector in the propagation track for detecting one of the domains from the splitter, and a second detector in an auxiliary propagation track which extends from the splitter, the detector outputs being combined to enhance the total output signal. The relative angular orientation of the detectors may be varied to provide any desired signal shaping. The passive splitter has features which ensure reliable domain splitting characteristics.

9 Claims, 8 Drawing Figures

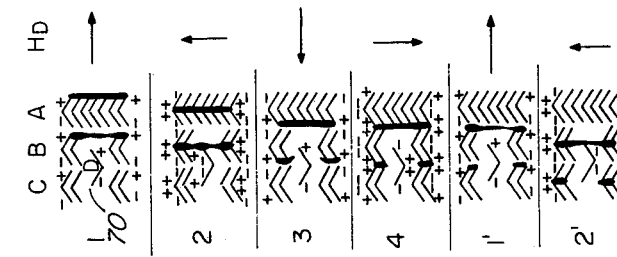
FIG. 6
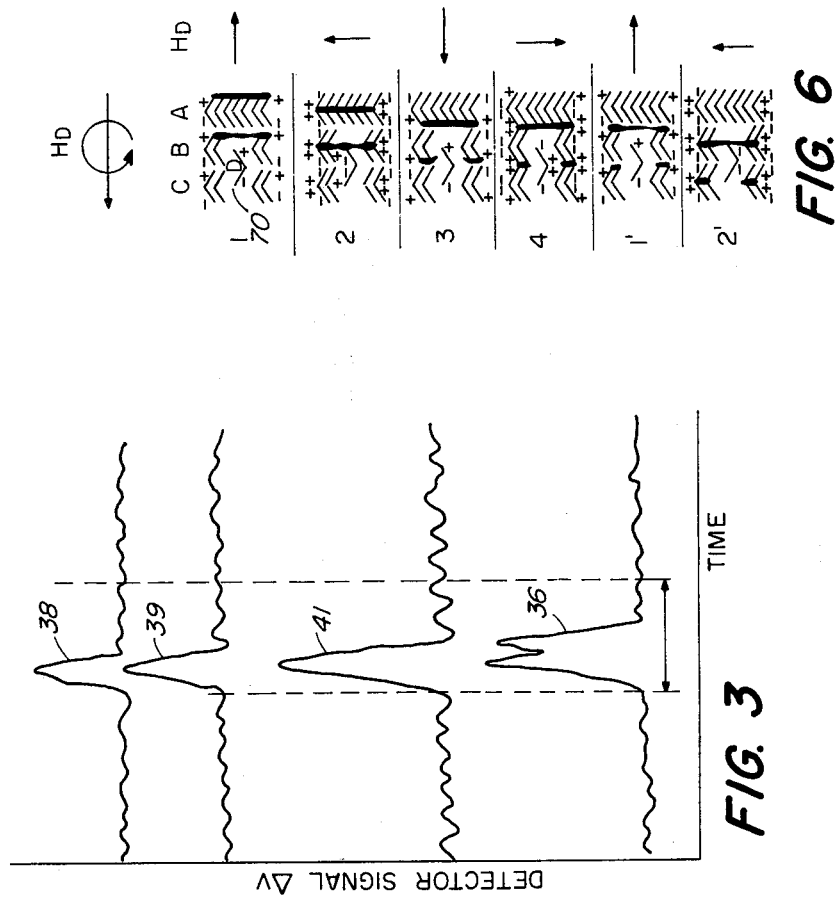
FIG. 3
FIG. 5
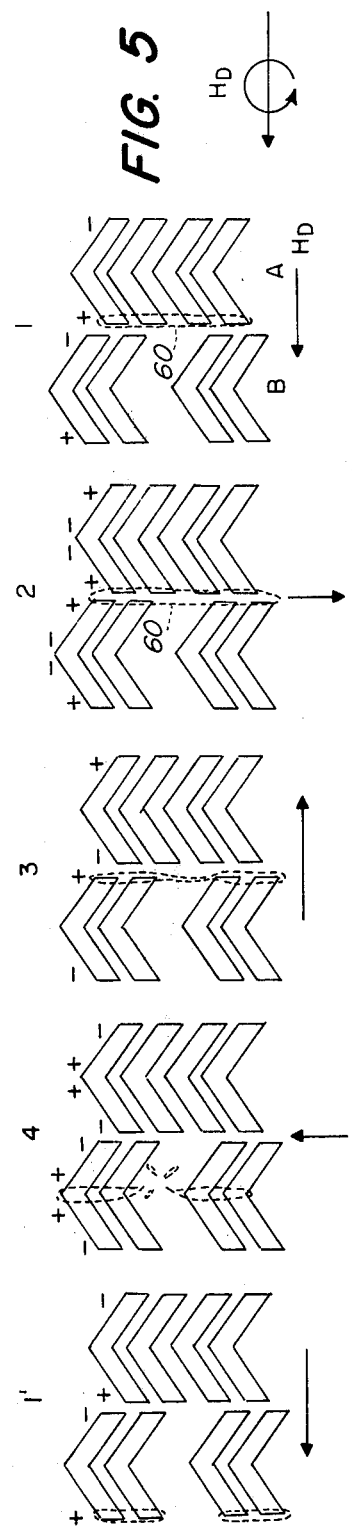
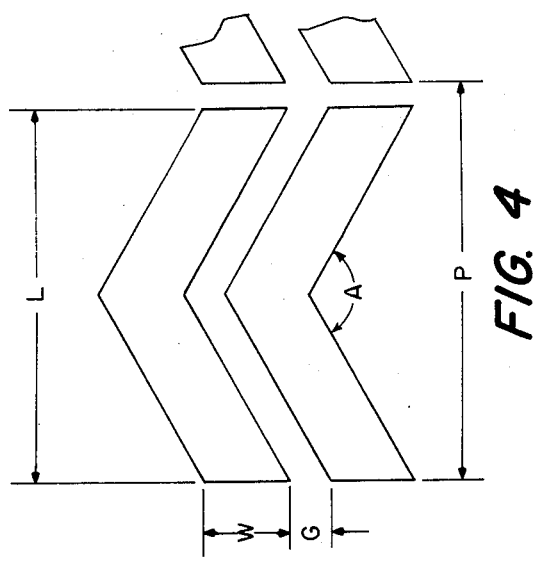
FIG. 4

COMPOUND DETECTOR FOR MAGNETIC DOMAIN MEMORY DEVICES

BACKGROUND OF THE INVENTION

Cylindrical magnetic domains in thin anisotropic single crystal layers of ferrimagnetic materials, usually termed bubbles, are well known. Field access domain devices have been described in the article "Magnetic Bubbles" by A. H. Bobeck and H. E. D. Scovil in Scientific American, Vol. 224 page 78. In these devices, domains are generated and moved along defined propagation tracks of magnetically soft elements, and components are incorporated for domain annihilation and loop to loop transfer. The ferrimagnetic layer is characterized by a uniaxial anisotropy normal to the plane of the layer which allows the bistable existence of cylindrical domains with their axes in the easy direction of magnetization. A rotating magnetic field in the plane of the magnetic track elements causes a pole pattern in these elements, thereby establishing periodically changing field gradients which interact with the bias field and provide the driving force for their movement. In these memory devices it is also required that for read-out of the binary information stored via the circulating domains, a magnetic field sensitive detector be incorporated. The detector must be particularly sensitive to the field of the on track, moving domains.

Among the types realized and described in the literature are silicon and indium antimonide Hall-effect detectors, Faraday rotation optical detectors and magneto-resistance detectors fabricated from ferromagnetic thin films. Hall-effect detectors require deposition and fabrication control of an additional material without significant improvement of the signal output of the detector and add an additional pair of Hall-voltage sensing leads. Optical detectors are complex in that they require a light source, polarizers and a light detector. The efficiency of the nearly crossed light attenuating polarizers is very low, and the lens-slit system to focus on a diameter the size of a bubble diameter (1 – 6$\mu$m) has to be rather sophisticated and costly. Although this type of detector is free from magnetically induced background signals, it has its own detector noise problems, is bulky and, as mentioned, is costly compared to magnetic film sensors. The magneto-resistance sensor is most practical and widely used since it can be fabricated from the same soft ferromagnetic material as the bubble propagation structure, either in a second deposition as a "thin film detector" or fabricated in one fabrication step with the propagation structure as a "thick film detector".

The magneto-resistance change $\Delta R$ is due to a transition between two different magnetized states in the plane of the magnetic film. For a polycrystalline film the resistivity, as a function of an in-plane field or the radial component of a magnetic domain, is given by:

(1)

$$\rho = \rho_\perp + \Delta\rho(H) \cos^2 \theta$$

where $\theta$ is the angle between the current and magnetization vectors of the magneto-resistance device.

$$\Delta\rho(H) = (\rho_\| - \rho_\perp) \qquad (2)$$

The above equation defines the resistivity change for the in-plane magnetic field in directions parallel and perpendicular to the current through the device. The magneto-resistance detector is most compatible technologically and has a reasonably large $\Delta\rho/\rho$ at room temperature.

The detector is most efficient when its size is comparable to the bubble or stretched strip domain dimensions, but demagnetizing fields are very high in detectors of this small size; for example, for 80 – 20 permalloy $\Delta\rho/\rho$ is approximately 5% and for films it is in the range from 1% to 2%. In small detectors $\Delta\rho/\rho$ is reduced to 0.5% to 1%. The bubble radial field, switching the detector, is of the order of 20 Oe which does not completely saturate the detector, thereby reducing the output from the detector further. These factors indicate the desirability of finding a way of increasing the output from magneto-resistance detectors. The output of the detector is given by:

$$\Delta V = I \Delta R \qquad (3)$$

for a constant current through the detector, where $\Delta R$ is due to the magnetic field change to be detected.

$$\Delta V = I \Delta \rho \frac{l}{wt} \qquad (4)$$

where $\Delta\rho$ is given in equation (2), $l$ is the effective detector length, $w$ is the detector width and $t$ is the thickness of the detector. $\Delta V$ is inversely proportional to the thickness, $t$, since $\Delta\rho$ is relatively insensitive to $t$ above 200A. Typically, the thin film detector is fabricated from 80 – 20 (Ni - Fe) permalloy in the thickness range from 200 to 400A. Films of this thickness are difficult to fabricate reproducibly and when operated at optimum signal output (50% of burn-out current), problems arise from short detector life in some cases. The thick film permalloy detector has a thickness in the range from 2000 to 4000A, depending on the design of the permalloy track and the coupling factor between the bubble and permalloy fields. According to equation (4), the thick film detector has a smaller output for the same current and in-plane dimensions.

Most commonly, permalloy detectors are the longitudinal stretch (Chinese letter) or transverse chevron type. The Chinese letter detector is usually used as a "thin film detector" such that the sensing element does not interfere with propagation. The output of this detector is a single pulse as the domain is stretched across the sensing element in less than ½ a period of the rotating magnetic field. Stretching in the direction of propagation is frequency-limited by the stretching mobility of the domain. Usually three or five stretching bars are used. With increasing frequency stretching is not completed, which results ultimately in domain hang-up at the detector. To increase frequency performance a shortening of the stretcher results in a shorter detector and according to equation (4) in a smaller signal.

A typical output from a 400A thick five stretcher detector is in the range from 0.5 to 0.8 mV at 66 kHz and 4 mA detector current. The most advanced type of the chevron detector, which consists of a stretching and a destretching ramp of chevron stacks, has its center conductor interconnections of alternate chevrons to provide a long magneto-resistive sensing element. Its advantages are that there are no inherent frequency limitations, assuming the ramp is long enough, since the stretching is transverse to the direction of propagation and that it can be fabricated together with the propagation structure in the same fabrication step. Dependent on the design of the chevron interconnections and their positions on the chevrons, one observes wide and multiple output peaks which can interfere with the readout of adjacent bubbles and make it difficult to multiplex signals from several storage devices. The signal output from 3000A thick chevron detector with 18 chevrons gives a peak signal of 1 mV for 4 mA where the output is up to 2.5 mA at 100 kHz. Here the signal loss due to a "thicker film" is compensated by design of a longer stretch and sensing element.

The system environment in which the detector is located also affects the detector output. The magnetization in the sensor of the detector is switched by the field of the domain and also by the rotating field and the influence of neighboring permalloy elements. A detector produces a coherent magneto-resistance background signal due to the in-plane, rotating field, the signal being at twice the frequency of the rotating magnetic field. This so-called 2f-signal at a rotating field of 30 Oe is 2mV for the thin film Chinese letter detector and 4.2 mV for the chevron detector at 4 mA. Additional background signal is generated in the voltage lead-out loop of the detector due to inductive pick-up by the area extended normal to the rotating field or by components of the fringe field at the edge of the rotating field coil. This inductive pick-up signal is in the range from 2 to 10 mV. The signal is somewhat dependent on the design and is largely minimized by close spacing of the detector leads on the memory board leading out of the field module. In an actual system environment, domain detector signals have to be extracted out of larger background signals. The large common-mode signals are minimized by differential sensing of signals from two similar detectors to buck out the 2f signal, and similar inductive loops are used to cancel the $d\phi/dt$ pick-up. The inductive voltage pick-up is given by:

$$E = 2\pi f B A \qquad (5)$$

where
$f$ = drive field frequency
$B$ = magnetic induction
$A$ = area extended normal to the magnetic flux of the drive field Significant here is that the induced voltage is proportional to the frequency and further illustrates the requirement of careful design at high frequencies. At a drive field of 30 Oe and a frequency of 100 kHz the peak pick-up voltage per unit area is $$\frac{E}{A} = B \times 10^{-8} \text{ (volt cm}^{-2})$$

or $$\frac{E}{A} = \omega B \times 10^{-8} \text{ (volt cm}^{-2})$$

SUMMARY OF THE INVENTION

According to the present invention, a domain splitter is located in the propagation path for a magnetic domain, the splitter generating multiple domains for each one which the splitter receives. Each resulting domain is directed to a detector and the outputs of the detectors are combined to provide a more reliable indication of the presence of a domain. The combination may include synchronous addition in which the amplitude is enhanced, thereby permitting the use of low amplitude, high frequency responding detectors. Also, the signals may be combined asynchronously to facilitate optimum shaping of detector output signals. Alternatively, the signals may be combined in coincidence logic circuitry to enhance the reliability of the domain detection function.

The invention also contemplates an improved passive domain splitter construction in which reliable splitting operation occurs through a transverse stretch chevron splitter occupying a small portion of the track overlay area.

BRIEF DESCRIPTION OF THE DRAWINGS

In the Drawings:

FIG. 3 is a graph of waveforms of individual detector outputs and combined outputs for the embodiments of FIG. 1 and FIG. 2;

FIG. 4 illustrates the shape of and designations of some dimensions of chevron elements;

FIG. 5 illustrates the operation of the domain splitter illustrated in FIG. 1 and FIG. 2;

FIG. 6 illustrates an alternative embodiment of a domain splitter;

FIG. 7 is a block diagram of an alternative embodiment for combining the detector output signals; and FIG. 8 is a block diagram of another alternative embodiment for combining the detector output signals.

DESCRIPTION OF THE EMBODIMENT

Figure 1:
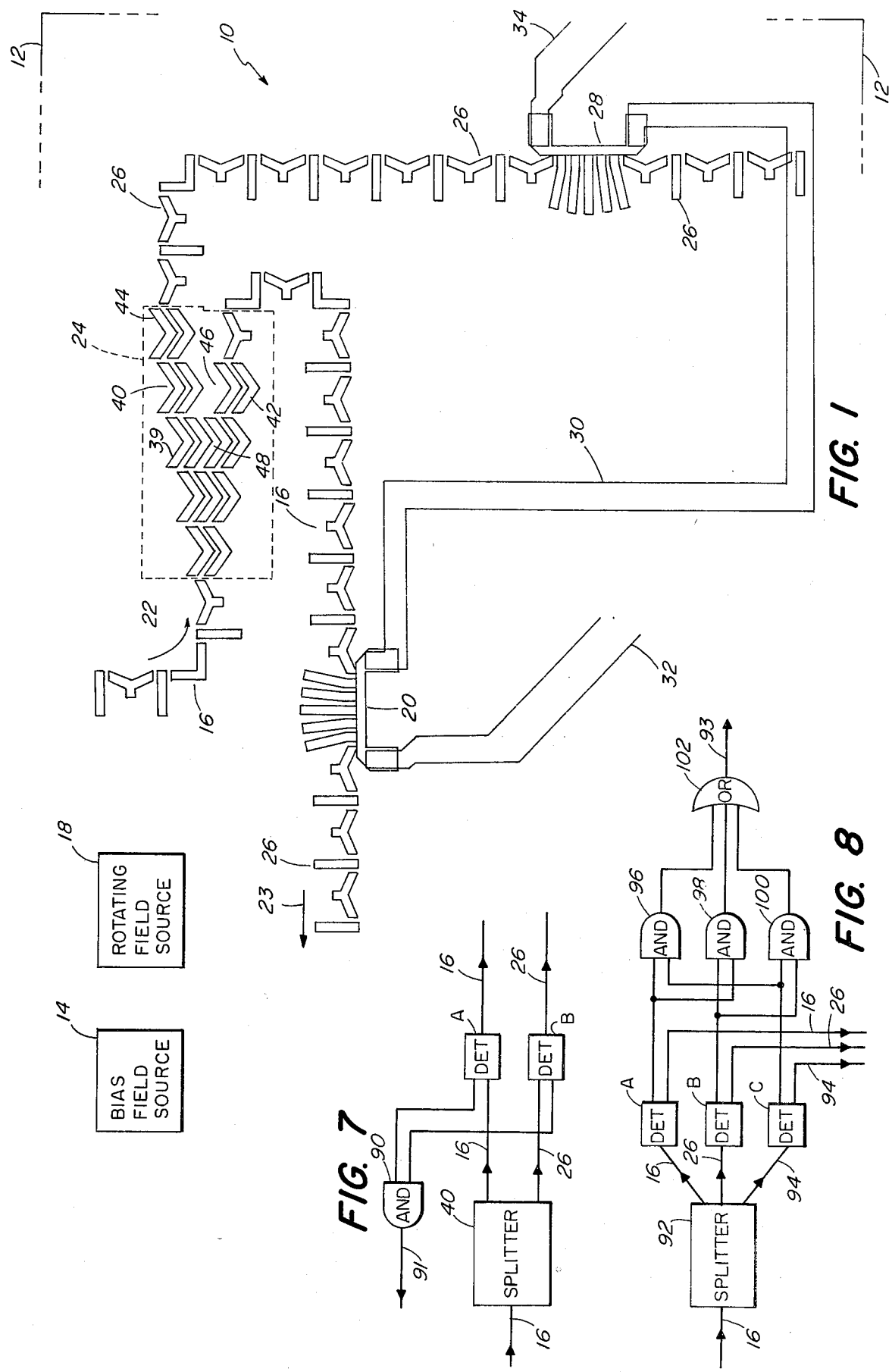
FIG. 1 illustrates a portion of a domain propagation track having a domain splitter and a compound detector according to the present invention.

An exemplary embodiment of the present invention is illustrated in FIG. 1 of the drawings. The present invention is an improvement in a magnetic domain memory device 10 of the type having a magnetic domain-sustaining platelet 12, a bias field source 14, a domain propagation overlay pattern including a domain propagation track 16, a rotating magnetic field source 18 and a first domain detector 20 disposed in the track 16. The above-mentioned elements are well known to those skilled in the art. Preferably, the propagation track is a Y-bar construction made of 80 – 20 permalloy material. In operation, domains within the platelet 12 move along the propagation track 16 in the direction indicated by the arrows 22 and 23.

A passive domain splitting device 24 is disposed along the propagation track 16 at a location with respect to the first domain detector 20 which is in a direction opposite to the propagation of the magnetic domains. The device 24 splits each domain entering therein into a pair of domains, one of which continues along the propagation track 16. An auxiliary propagation track 26 extends from the domain splitter 24 to define a propagation path for the other domain. A second domain detector 28 is disposed along the auxiliary track 26 to detect the other domain. Any domain detector may be used, such as the silicon and indium antimonide Hall-effect, the Faraday rotation optical and the magneto-resistance detectors. Preferably, a magneto-resistance detector, and specifically a Chinese letter or longitudinal stretch detector, as shown in FIG. 1, is utilized.

The difference in time for each of the pair of domains to reach their respective detectors is less than the time for a rotation or cycle of the rotating magnetic field from the source 18. The output signals from both detectors 20 and 28 are connected in series through a conductive strip 30 to produce a combined detector output signal across a pair of conductive strips 32 and 34.

The primary purpose of the features of the domain splitter and the pair of detectors is to generate two detector signals for each domain in the propagation track upstream from the splitter and, more importantly, to combine the signals so that they at least partially overlap in time. This provides an increase in the magnitude of the detection signals which minimizes some of the problems which were previously referred to. In FIG. 1 the detectors are at a relative angle with respect to each other. Preferably, as in FIG. 1, this angle is 90° so that the output signals are out of phase by ¼ of a cycle of the rotating magnetic field. The phase difference is, however, always less than 360° or one full cycle of the rotating magnetic field. The effect of the phase delay is to produce a narrowing of the central portion of the combined output signal as shown in waveform 36 in FIG. 3. The phase shifted signals give a partial overlap of the two signals and a narrowing of the peak portion of the signal which is desirable for multiplexing of the readout of several bubble domain devices. Multiplexing ability is desirable since it reduces the number of semiconductor devices required in the read-out electronics of the bubble memory system.

Figure 2:
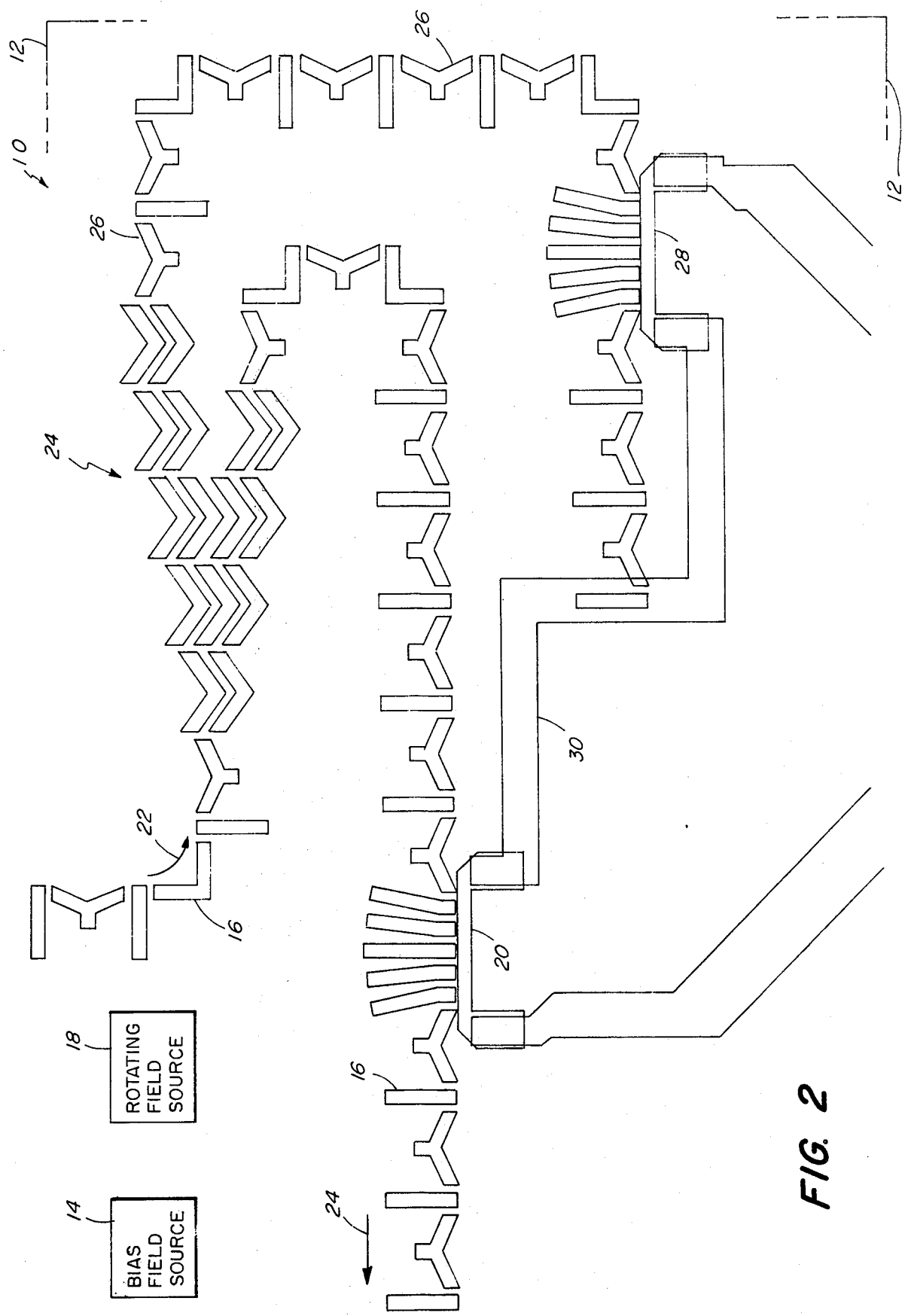
FIG. 2 is an alternative embodiment of the compound detector in FIG. 1 in which the detector outputs are synchronous.

FIG. 2 is an alternative embodiment of the magnetic domain memory device according to the present invention. FIG. 2 differs from FIG. 1 only in that the relative angle between the detectors 20 and 28 is 0°. This, coupled with the fact that the domains reach their respective detectors at the same cycle of the rotating magnetic field, means that the outputs from the detectors are synchronous. The other waveforms in FIG. 3 illustrate this feature. The detectors 20 and 28 generate outputs shown as waveforms 38 and 39; the waveforms are of ΔV versus time. Waveform 41 is the combined output. One advantage of signal addition is that shorter detectors, such as the three stretcher Chinese letter type may be used. As stated previously, this detector has a higher cut-off frequency than the five stretcher type in FIGS. 1 and 2 but a smaller output signal. By doubling the output, one may use the device at higher frequencies which reduces the access time. The invention contemplates forming N domains for each original domain, where N is greater than one, and combining N detector signals. For example, a splitter could be disposed in the auxiliary track 26 and another detector could be disposed in a second auxiliary track extending from that splitter, thereby detecting three domains for every original domain.

FIGS. 1 and 2 illustrate a method of detecting a magnetic domain in a magnetic domain memory device 10 including the following steps. A first domain is propagated along a defined propagation track, such as the track 16. This domain is then split into at least a second and third domain at a location in the propagation track, the second domain continuing along the propagation track. The third domain is propagated along an auxiliary track. Output signals representing the detection of the second and third domains are then generated during at least partially common time intervals. Lastly, these output signals are combined. In a preferred feature of the method, the signals are generated in synchronism.

While FIGS. 1 and 2 show a particular splitter having features to be described subsequently, it should be understood that domain splitters per se, either passive or active, are not novel, and any domain splitter could be used in lieu of the device 24. For example, a chevron type passive domain splitter is described in a publication of an abstract of a paper given at the 20th Annual Conference on Magnetism and Magnetic Materials, by T. J. Nelson, given in San Francisco on Dec. 3 through 6, 1974. The abstract described a passive splitter including an expander, which elongates domains up to a height of nine chevrons, two three element chevrons out going tracks and a cutter or elongated chevrons in the middle of the column. As understood, the splitter in this abstract is used to divide a domain in a circulating loop such that one divided domain remains in the loop while the other propagates to a single transverse stretch chevron detector which emits the stretched domain directly into a guard rail. The splitter eliminates reducing the fully stretched domain back to a cylindrical domain. A passive domain splitter is also described in "A self-contained Magnet Bubble domain Memory Chip", by Chang, IEEE Transactions on Magnetics, Vol. Mag. 8, No. 2, (June 1972). However, this splitter operates in a small bias field range relative to the propagate margins thereby reducing the range for the overall system. These publications do not suggest the use of a splitter for enhancement of detector output signals.

In the preferred embodiments, the passive domain splitting device 24 includes an arrangement of chevron shaped elements for stretching the magnetic domains transversely to the direction of propagation. In FIG. 1, the arrangement includes a domain expander having a plurality of stacks of chevron-shaped elements, the number of elements in each stack increasing in the direction of domain propagation so that the domain is stretched transversely across the last stack 39 which has the largest number of elements. A pair of domain dividing stacks 42 and 40 are located adjacent to the last expander stack 39 from the outermost transverse direction. These stacks form a central gap 46 which provides equal magnetic field forces from the chevrons at the transition from the expander to the divider during the pinching and dividing portion of the rotating magnetic field. This is required so that the domain will not be pulled toward one of the exit ports without dividing. In FIG. 1, the last expander stack 39 has four chevron elements, and each of the divider stacks 42 and 40 has two chevron elements. In one preferred feature of the splitter, the gap 48 between the central pair of chevron elements of the stack 39 is at least equal to twice the gap between any other pair of chevron elements in the last stack. This feature causes the domain to neck down in the region of the gap and to facilitate the splitting process. In addition, the gap 46 is at least equal to the width of the chevron in the transverse direction plus twice the gap between any pair of chevron elements in the dividing stack, so as to prevent propagation of the domain as a single strip. This feature is shown more clearly in FIG. 4 which illustrates the dimensions of a permalloy element for a device in which the nominal domain diameter is 6 $\mu$m.

P = 25.4$\mu$m
L = 23$\mu$m
A = 115°
W = 4.2$\mu$m

G = 2.1μm

The gap 46 in FIG. 1 thus is equal to or greater than W + 2G or 8.4μm. If the number of chevrons on each of the dividing stacks is increased, the dividing stability of the device will be improved.

The operation of the preferred domain splitter is illustrated with reference to FIG. 5; this Figure shows the same splitter in FIGS. 1 and 2 except with an opposite direction of domain propagation. The soft magnetic permalloy chevron elements are adjacent to the domain sustaining platelet 12 which typically is a garnet crystal. The bias field from source 14 is up (out of the drawing); thus, (−) domain poles or S-poles are in contact with the track and are attracted to the (+) N-poles in the permalloy. The rotating field from source 18 is counterclockwise producing a right to left propagation direction of (+) N-poles in the permalloy elements and of the domains.

A domain 60 has been transversely stretched in propagating along a chevron stretcher and is expanded over 4 chevrons in stack A 1 which corresponds to the stack 40 in FIG. 1. In phase 1 domain 60 is located at the exit of chevron stack A during the time the drive field is oriented in the direction of propagation. In phase 2, as the counterclockwise rotating drive field has moved through 90°, the domain strip 60 has advanced into the gap between stacks A and B and is slightly pinched in the center due to the higher magnetic field in the gap of stack B. In phase 3 the domain stretches across the right ends of stack B and is further pinched in the center in the free crystal portion of stack B. As the field rotates further to the up position, the center part of the domain collapses since a strip domain cannot be supported in the presence of the bias field and the vertical component of the drive field produced at the edges of the permalloy structure. Therefore, the strip is divided into two pieces travelling along separate tracks as shown in drive field phase 1'.

FIG. 6 illustrates an alternative embodiment of the present invention in which a magnetic element 70 is located in the central gap between the dividing stacks of chevron elements. Preferably, this element is at least one inverted chevron element as shown in FIG. 6. An inverted chevron has an opposite propagation direction thus providing a dividing field which is activated by the drive field. The element 70 can also be a bar equivalent in direction to a right-half of an inverted chevron. Enlargement of the center gap at the exit of stack A enhances cutting.

In operation, the central structure, fed by strip domains from the chevron expander having several elements, and delivering outputs, on separate chevron tracks, consists of a regular chevron stack A, a double chevron stack B, each half stack separated by a free crystal gap. Stack C is similar to and adjacent to stack B. In the free crystal gap of the stacks beyond stack A another stack D is centrally located. The chevron is inverted in stack D but several chevrons may be in the stack. The chevron 70 acts as a domain dividing element since the inverted chevron propagates a domain in an opposite direction compared with the normal chevron elements. In other words, in chevron 70 positive poles are moving to the left while in the other chevrons positive poles are propagated to the right. The negative bubble pole travels with the positive permalloy pole. The prepinched domain strip in phase 2 of the drive field encounters in the next field quadrant a negative (repelling) pole which increases in strength and repells the domain in its center to the right stretching the domain, while the upper and lower domain tips are moved to the left. The increase in the local field causes the domain to sever at its center.

FIGS. 7 and 8 illustrate two embodiments of coincident logic circuitry for enhancing the reliability of the domain detection process. There is a certain probability that any detector can generate a spurious output which may be either a false logic "1" or a false logic "0". The circuitry in FIG. 7 reduces the probability of a false output due to either detector A or B generating a false logic "1". FIG. 8 illustrates circuitry which reduces the probability of a false output due to any of three detectors A, B, or C generating either a false logic "1" or "0".

In FIG. 7, the splitter, such as the domain splitter 24 in FIG. 1, has extending therefrom the propagation track 16 and the auxiliary track 26. Tracks 16 and 26 are coupled to detectors A and B, respectively. The output of each detector is applied to the input of an AND gate 90. The propagation tracks 16 and 26 extend to the right of the detectors A and B; the track 26 may extend to a guard rail or annihilator (not shown). The detectors A and B differ from the detectors 20 and 28 in FIGS. 1 and 2 in that the outputs are not connected in series to provide a net output signal. Rather, each is applied separately to the gate 90. The output 91 from the AND gate 90 is the net output of the domain detector process.

The operation of the coincidence logic circuitry is as follows. If no false operation is present and if the detectors both sense a logic "1", the output of AND gate 90 is a logic "1" as it should be, since both inputs are "1"s. Likewise, if no false operation is present and if the detectors both sense a logic "0" (i.e., do not detect a domain), the outputs of the AND gate 90 is a logic "0". The purpose of the circuitry is to prevent a logic "1" output when neither detector should sense a domain, but for some reason, one detector generates a spurious logic "1". When this does occur, the gate 90 is not enabled because only one input is a logic "1".

In FIG. 8, a splitter 92 splits each domain into three. A suitable splitter for this purpose includes the splitter 24 with outgoing tracks 16 and 26 and another splitter 24 (not shown) in the track 26 with outgoing tracks 26 and 94. The track 94 leads to a third detector C. The coincidence logic circuitry includes AND gates 96 and 98 and 100 and an OR gate 102 receiving the outputs of the AND gates. The output 93 of the OR gate 102 is the net output of the domain detector process. Each AND gate receives an input from each of two detectors, and no two gates receive inputs from the same two detectors. The Boolean expression for the output of OR 102 is A.C + A.B. + B.C. If all detector outputs are "1"s, the output is a logic "1"; likewise, if all detector outputs are "0"s, the output is a logic "0". If any one detector generates a false logic "1", the output is a logic "0". And lastly, if any detector generates a false logic "0" (i.e., the three should generate "1"s), the output of the OR gate 102 is a logic "1". The propagation tracks 16, 26 and 94 extend from the detectors A, B and C, respectively; tracks 26 and 94 may extend to a guard rail or annihilator (not shown).

The embodiments of the present invention are intended to be merely exemplary and those skilled in the art shall be able to make numerous variations and modifications to them without departing from the spirit of the present invention. All such variations and modifications are intended to be within the scope of the present invention as defined in the appended claims.

We claim:

1. In a magnetic domain memory device of the type having a magnetic domain sustaining platelet, a bias field source, a domain propagation overlay pattern including a domain propagation track, a rotating magnetic field source, and a first domain detector disposed in the track, an improvement including:
   a. domain splitting means, disposed along the propagation track, for splitting each bubble domain entering therein into a pair of domains before the domain reaches the first detector, one of the resulting domains continuing along the propagation track toward the first detector,
   b. an auxiliary propagation track extending from the domain splitting means and defining a path for the other domain,
   c. a second domain detector disposed along the auxiliary track for detecting the other domain, the difference in time for each of the pair of domains to reach their respective detectors being less than the time for one rotation of the rotating magnetic field, and
   d. means for combining the output signal from both detectors to produce an enhanced detector output signal, the combining means including connecting the detector output signals in series, the detectors being at a relative angle with respect to each other to produce a partial overlap of the two detector output signals and a narrowing of the central portion of the combined output signal.

2. The improvement according to claim 1, wherein the relative angle is about 90°.

3. In a magnetic domain memory device of the type having a magnetic domain sustaining platelet, a bias field source, a domain propagation overlay pattern including a domain propagation track, a rotating magnetic field source, and a first domain detector disposed in the track, an improvement including:
   a. domain splitting means, disposed along the propagation track, for splitting each bubble domain entering therein into a pair of domains before the domain reaches the first detector, one of the resulting domains continuing along the propagation track toward the first detector,
   b. an auxiliary propagation track extending from the domain splitting means and defining a path for the other domain,
   c. a second domain detector disposed along the auxiliary track for detecting the other domain, the difference in time for each of the pair of domains to reach their respective detectors being less than the time for one rotation of the rotating magnetic field, and
   d. means for combining the output signal from both detectors to produce an enhanced detector output signal, the combining means including coincidence logic circuitry receiving the detector outputs to enhance the reliability of the domain detectors.

4. In the magnetic domain memory device of the type having a magnetic domain sustaining platelet, a bias field source, a domain propagation overlay pattern including a domain propagation track, a rotating magnetic field source, and a first domain detector disposed in the track, an improvement including:
   a. domain splitting means, disposed along the propagation track, for splitting each bubble domain entering therein into a pair of domains before the domain reaches the first detector, one of the resulting domains continuing along the propagation track toward the first detector,
   b. an auxiliary propagation track extending from the domain splitting means and defining a path for the other domain,
   c. a second domain detector disposed along the auxiliary track for detecting the other domain, the difference in time for each of the pair of domains to reach their respective detectors being less than the time for one rotation of the rotating magnetic field,
   d. means for combining the output signal from both detectors to produce an enhanced detector output signal, the combining means including connecting the detector output signals in series, and
   e. the domain splitting means being a passive domain splitter including an arrangement of chevron-shaped elements for stretching the magnetic domain transversely to the direction of propagation, the arrangement including a domain expander having a plurality of stacks of chevron-shaped elements, the number of elements in each stack increasing in the direction of domain propagation so that the domain is stretched transversely across the last stack having the largest number of elements and a pair of domain dividing stacks located adjacent to the last expander stack from the outermost transverse direction thereof and forming a central gap therebetween to provide equal magnetic field forces from the chevrons at the transition from the expander to the divider during a pinching and dividing portion of the rotating magnetic field, the gap between the central pair of chevron elements in the last stack in the expander being at least equal to twice the gap between any other pair of chevron elements in the last stack to cause the domain to neck down in the region of the gap.

5. The improvement according to claim 4, wherein the gap between the pair of dividing stacks of chevron elements is at least equal to the width of the chevron in the transverse direction plus twice the gap between any pair of chevron elements in the dividing stacks to prevent propagation of the domain as a single strip.

6. The improvement according to claim 4, wherein the circuitry includes an AND gate receiving as inputs the outputs of the first and second detectors.

7. The improvement according to claim 4, further including means for splitting each domain into three domains and a third detector for detecting the third domain and wherein the circuitry includes three AND gates, each receiving an input from each of two detectors, no two gates receiving inputs from the same two detectors, and an OR gate receiving the AND gate outputs.

8. In a magnetic domain memory device of the type having a magnetic domain sustaining platelet, a bias field source, a domain propagation overlay pattern including a domain propagation track, a rotating magnetic field source, and a first domain detector disposed in the track, an improvement including:
   a. domain splitting means, disposed along the propagation track, for splitting each bubble domain entering therein into a pair of domains before the domain reaches the first detector, one of the resulting domains continuing along the propagation track toward the first detector, b. an auxiliary propagation track extending from the domain splitting means and defining a path for the other domain,
c. a second domain detector disposed along the auxiliary track for detecting the other domain, the difference in time for each of the pair of domains to reach their respective detectors being less than the time for one rotation of the rotating magnetic field,
d. means for combining the output signal from both detectors to produce an enhanced detector output signal, the combining means including connecting the detector output signals in series, and
e. the domain splitting means being a passive domain splitter including an arrangement of chevron-shaped elements for stretching the magnetic domain transversely to the direction of propagation, the arrangement including a domain expander having a plurality of stacks of chevron-shaped elements, the number of elements in each stack increasing in the direction of domain propagation so that the domain is stretched transversely across the last stack having the largest number of elements and a pair of domain dividing stacks located adjacent to the last expander stack from the outermost transverse direction thereof and forming a central gap therebetween to provide equal magnetic field forces from the chevrons at the transition from the expander to the divider during a pinching and dividing portion of the rotating magnetic field, the domain splitting means further including a magnetic element disposed in the central gap between the dividing stacks of chevron elements, the magnetic element assisting in cutting the domain after it enters the dividing stacks.

9. The improvement according to claim 8, wherein the magnetic element is at least one inverted chevron element.

* * * * *